(12) United States Patent
Moindron

(10) Patent No.: US 7,652,864 B2
(45) Date of Patent: Jan. 26, 2010

(54) THERMAL PROTECTION OF A SWITCH

(75) Inventor: Laurent Moindron, Notre Dame d'Oe (FR)

(73) Assignee: STMicroelectronics S.A., Montrouge (FR)

( * ) Notice: Subject to any disclaimer, the term of this patent is extended or adjusted under 35 U.S.C. 154(b) by 129 days.

(21) Appl. No.: 11/807,510

(22) Filed: May 29, 2007

(65) Prior Publication Data

US 2007/0279070 A1 Dec. 6, 2007

(30) Foreign Application Priority Data

May 30, 2006 (FR) .................................. 06 51946

(51) Int. Cl.
*H02H 7/00* (2006.01)
*G05D 23/00* (2006.01)
(52) U.S. Cl. ..................... 361/103; 361/93.1; 318/641
(58) Field of Classification Search ................ 361/103, 361/93.1, 93.8; 318/641
See application file for complete search history.

(56) References Cited

U.S. PATENT DOCUMENTS

| 4,641,066 A * | 2/1987 | Nagata et al. .......... 318/400.37 |
| 5,070,322 A | 12/1991 | Fujihira |
| 5,940,785 A | 8/1999 | Georgiou et al. |
| 6,052,268 A | 4/2000 | Thomas |
| 7,035,157 B2 * | 4/2006 | Chang ........................ 365/222 |
| 7,291,986 B2 * | 11/2007 | Ionescu ...................... 315/276 |
| 7,295,789 B2 * | 11/2007 | Inukai ......................... 399/67 |
| 2004/0179576 A1 | 9/2004 | Bowden et al. |

FOREIGN PATENT DOCUMENTS

DE 197 43 253 A1 4/1999

OTHER PUBLICATIONS

AN-236, Application Note, Jan. 1980, National Semiconductor Corporation.*
French Search Report from French Patent Application 06/51946, filed May 30, 2006.

* cited by examiner

*Primary Examiner*—Stephen W Jackson
*Assistant Examiner*—Zeev Kitov
(74) *Attorney, Agent, or Firm*—Lisa K. Jorgenson; James H. Morris; Wolf, Greenfield & Sacks, P.C.

(57) ABSTRACT

A method and a circuit for detecting an overheating of an electronic switch of power supply of a load by an A.C. voltage, in which a voltage representative of the temperature in the vicinity of the switch is compared with a threshold, the result of this comparison being sampled at frequency corresponding to an even multiple of the frequency of the A.C. power supply voltage, to provide a signal indicative of the fact that a temperature threshold has been exceeded.

8 Claims, 4 Drawing Sheets

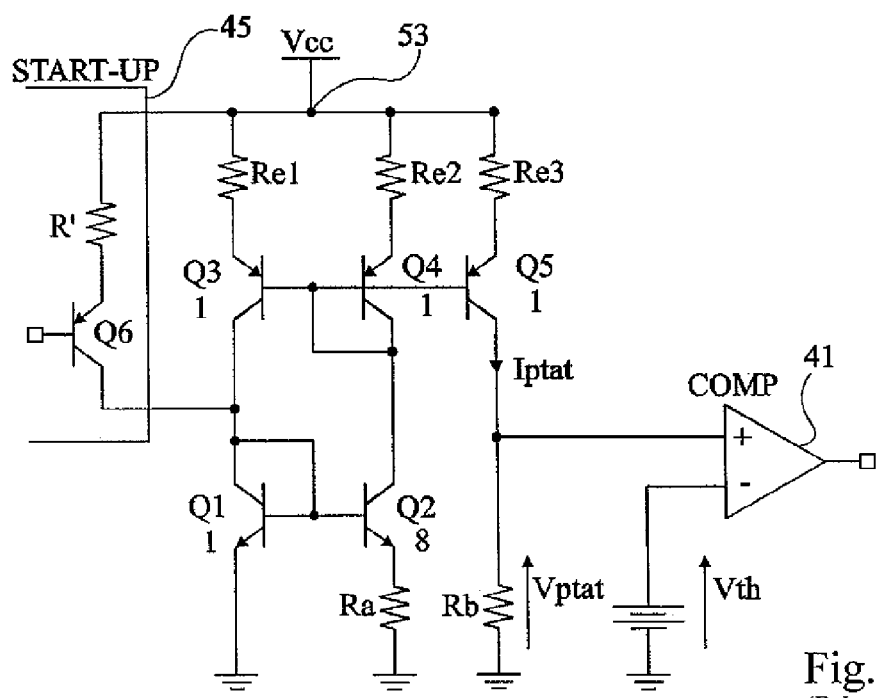
Fig. 4
(Prior Art)
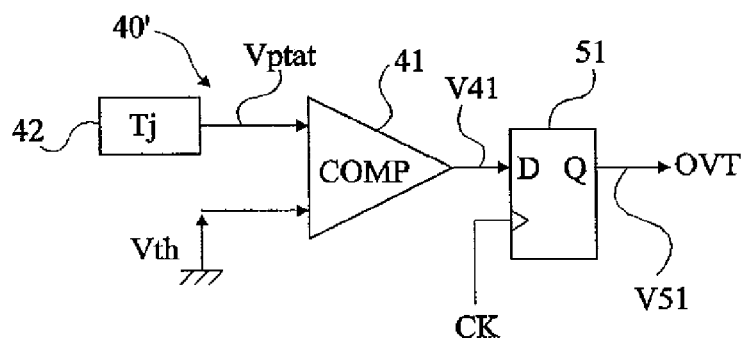
Fig 5
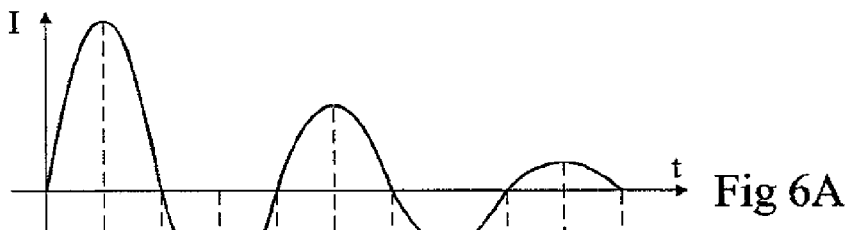
Fig 6A
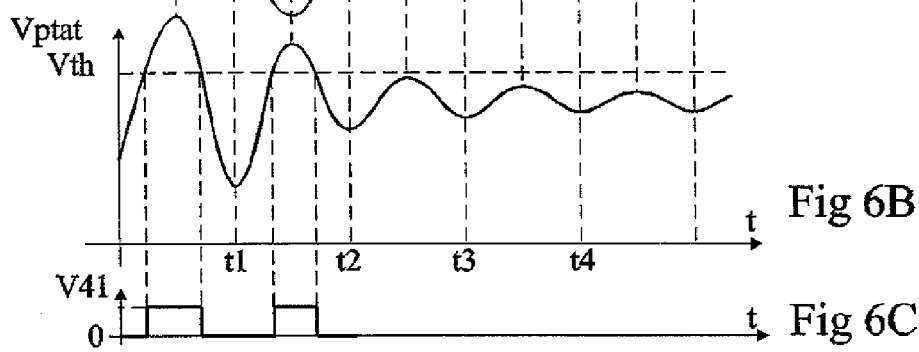
Fig 6B
Fig 6C

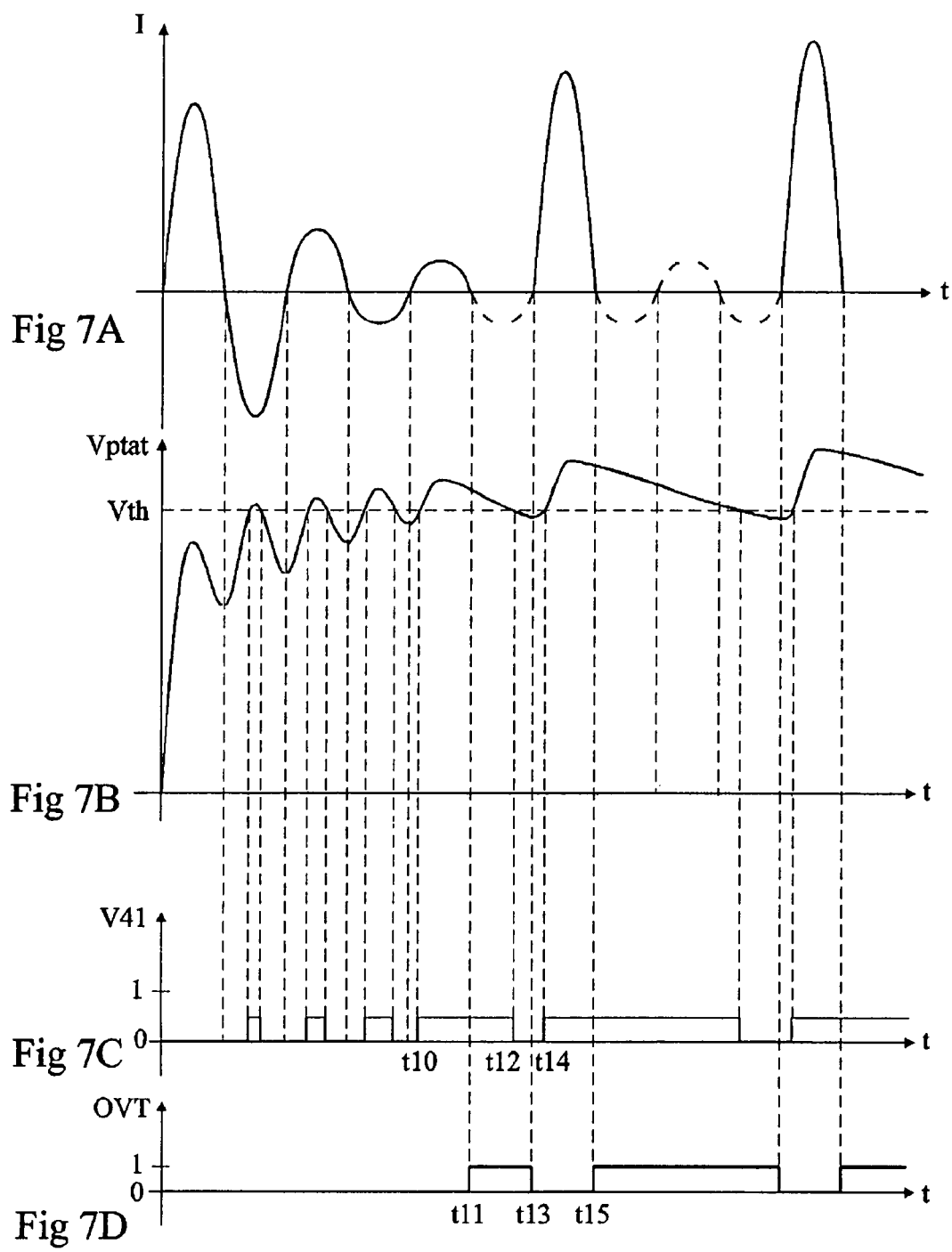

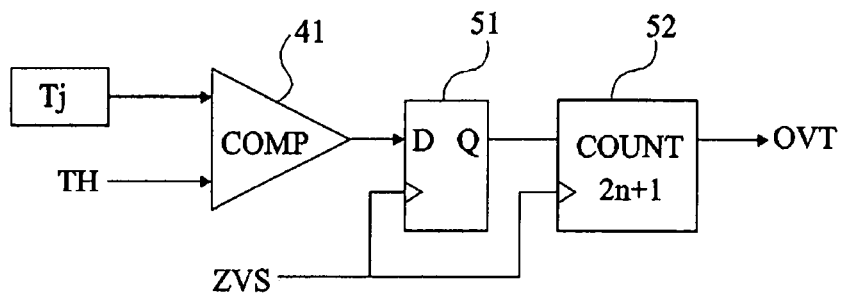
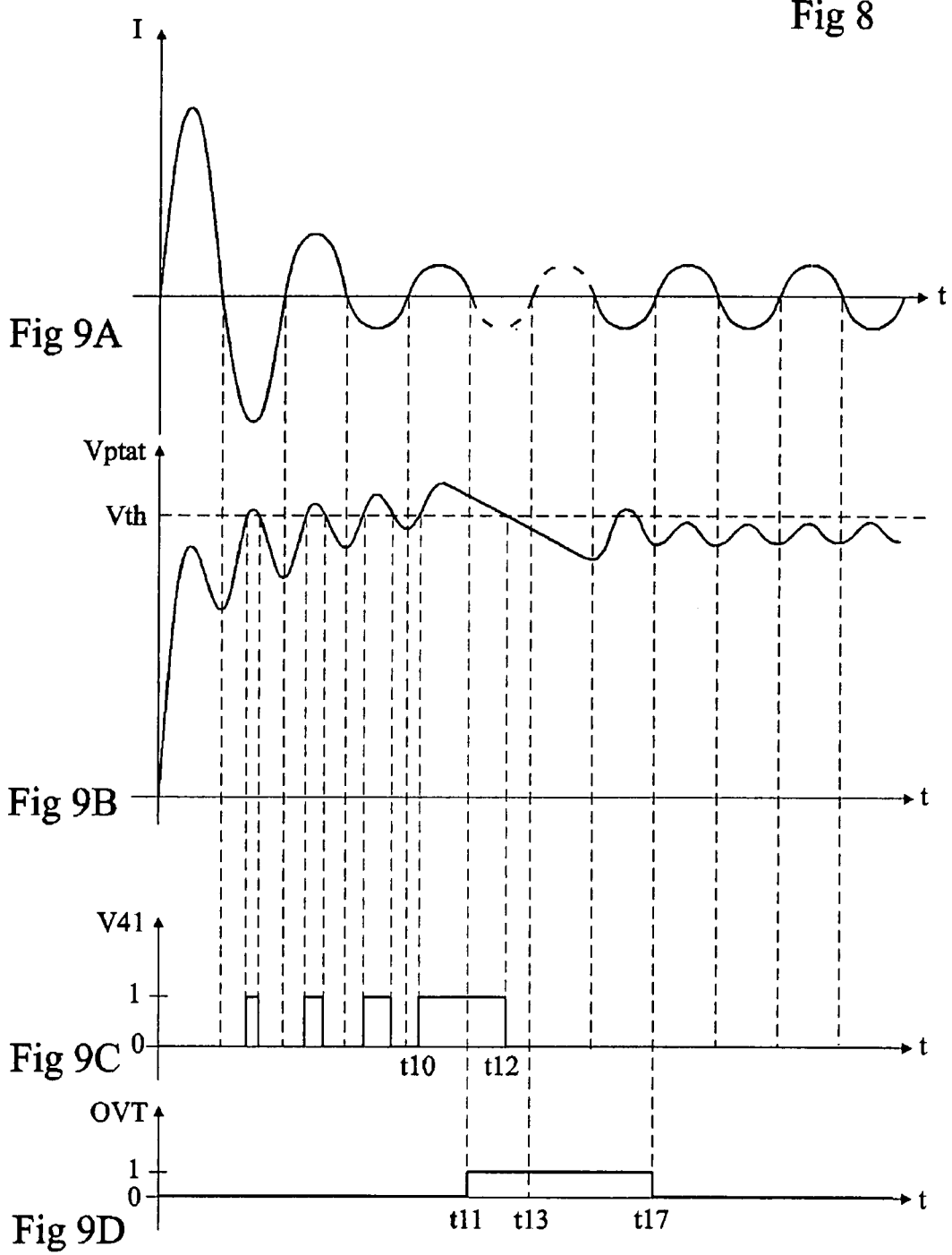
Fig 8
Fig 9A
Fig 9B
Fig 9C
Fig 9D

THERMAL PROTECTION OF A SWITCH

BACKGROUND OF THE INVENTION

1. Field of the Invention

The present invention generally relates to electronic circuits and more specifically to the protection of a switch for controlling a load powered by an A.C. voltage against possible overheating. The present invention more specifically applies to bidirectional switches which are not controllable to be turned off.

2. Discussion of the Related Art

FIG. 1 is a schematic block diagram of an example of a system of powering of a load 1 (M) by an A.C. voltage Vac, for example, the electric supply network mains voltage. Load 1 is controlled by a bidirectional switch 10 (for example, a triac) with which it is series-connected between two terminals 2 and 3 of application of voltage Vac. Switch 10 is not controllable to be turned off in that, while it turns off by removal of the current that it conducts, it cannot be turned off by an action on its control terminal. Switch 10 is associated with a control circuit 20 (CTRL PART) in an integrated circuit. Circuit 20 may be controlled by a digital unit 30 (MCU) which then receives one or several signals from circuit 20 (especially a signal indicating the state of switch 10) and provides it with one or several control signals. Control circuit 20 and unit 30 are powered by a D.C. voltage Vcc applied, in this example, between terminal 2 and a ground terminal 4.

Switch 10 and its control circuit 20 are placed in a same package 5 having external connection terminals connected to the rest of the assembly. In this example, two terminals 51 and 52, connected inside of package 5 to the power electrodes of triac 10, are respectively connected to terminal 2 and to a first terminal of load 1. Two terminals 53 and 54 represent the supply terminals of control circuit 20 and are thus respectively connected to terminals 2 and 4. At least two terminals 55 and 56 are connected to control unit 30.

FIG. 2 is a simplified view of a packaged circuit 5 comprising switch 10 and its control circuit 20. In this example, triac 10 is a monolithic component placed on a support 57 next to integrated circuit 20. Gate G of the triac is connected by a conductor 58 to the corresponding terminal 21 (FIG. 1) of control circuit 20. The assembly is generally encapsulated in a resin 59 to form circuit 5.

In applications aimed at by the present invention, control circuit 20 comprises a temperature detection circuit intended to detect a heating up of switch 10, for example, to detect an overcharge. Such a temperature detection circuit compares information representative of the switch temperature (for example, a junction temperature) with a threshold to detect a possible exceeding thereof. The function of this temperature detection is to inhibit the turning on (at the next halfwave) of switch 10 to avoid for it to be damaged.

The detector is either placed next to switch 10, as illustrated in FIG. 2, by being integrated to circuit 20, or directly placed on the component forming the switch. In this case, the detection result is provided to circuit 20 and/or to circuit 30.

FIG. 3 schematically shows an example of a conventional thermal detector. This circuit generally belongs to circuit 20 (FIG. 1). A comparator 41 (COMP), having a first input receiving the result of a measurement of a junction temperature Tj performed by a detector 42 and having a second input receiving a temperature threshold, provides a two-state signal OVT, indicative of whether threshold TH has been exceeded by the measured current temperature Tj.

FIG. 4 shows an example of an electric diagram of thermal detector 42 shown in FIG. 3. Comparator 41 is a differential amplifier having an input (for example, inverting) receiving a temperature-stable voltage Vth of band-gap type, and having its other input (for example, non-inverting) receiving a voltage Vptat proportional to the integrated circuit temperature. Voltage Vptat is sampled from the junction point of a PNP-type transistor Q5 and of a resistor Rb. Grounded resistor Rb is used as a current-to-voltage converter of a current Iptat proportional to the temperature corresponding to the collector current of transistor Q5. The emitter of transistor Q5 is connected to terminal 53 of application of supply voltage Vcc by means of a resistor Re3. Transistor Q5 copies the current of a so-called ΔVbe/R current source. This source is formed of two parallel branches between terminal 53 and the ground. A first branch comprises, in series, an emitter biasing resistor Re1, a PNP-type bipolar transistor Q3, and an NPN-type bipolar transistor Q1. A second branch comprises, in series, an emitter biasing resistor Re2, a PNP-type bipolar transistor Q4, an NPN-type bipolar transistor Q2, and an emitter resistor Ra. Transistors Q1 and Q4 are diode-assembled. Transistor Q4 is mirror-assembled on transistor Q3 and transistor Q1 is mirror-assembled on transistor Q2. Assuming that transistor Q5 has the same surface area (1) as transistor Q4, voltage Vptat is a function of temperature T, provided by the following relation:

$$Vptat = \frac{Re2}{Re3} \cdot \frac{Rb}{Ra} \cdot \frac{k \cdot T}{Q} \cdot \text{Ln}\left(\frac{a2 \cdot a3}{a1 \cdot a4}\right),$$

where a1, a2, a3, and a4 represent the respective surface areas (1, 8, 1, and 1 in this example) of transistors Q1 to Q4, k designates Boltzmann's constant, and Q designate the electron charge.

The only variable in the above relation is, for a given circuit, temperature T.

To start the circuit, a transient current needs to be applied to the ΔVbe/R source. For this purpose, a start-up circuit 45, formed of a resistor R' in series with a PNP-type bipolar transistor Q6, connects terminal 53 to the junction point (common collector) of transistors Q3 and Q1. The base of transistor Q6 receives a turn-on control pulse to start a measurement. This pulse is provided, for example, by unit 30.

The more the temperature increases, the more voltage Vptat increases. Since voltage Vth is stable in temperature, it sets a triggering threshold of the comparator. This threshold is adjusted by the ratio between resistors Rb and Ra. Comparator 41 is formed, for example, by means of an operational amplifier.

A disadvantage of the detector of FIG. 4 is that, on initial powering-on of load 1, switch 10 is likely to transiently exceed the triggering temperature. Now, a temperature peak of short duration generally poses no problem and should not be considered as an overheating. However, the output of comparator 41 risks inhibiting the turning-on of switch 10.

SUMMARY OF THE INVENTION

The present invention features overcoming all or part of the disadvantages of known circuits of detection of the overheating of an A.C. power supply switch.

The present invention more specifically features avoiding an untimely triggering by transient overcharge phenomena.

The present invention also aims at a solution compatible with an operation on any load (resistive and/or capacitive and/or inductive).

To achieve all or part of these objects, as well as others, the present invention provides a method for detecting an overheating of an electronic switch of power supply of a load by an A.C. voltage, in which a voltage representative of the temperature in the vicinity of the switch is compared with a threshold, the result of this comparison being sampled at a frequency corresponding to an even multiple of the frequency of the A.C. supply voltage, to provide a signal indicative of the fact that a temperature threshold has been exceeded.

According to an embodiment of the present invention, the sampling frequency corresponds to twice the frequency of the power supply voltage.

According to an embodiment of the present invention, a deactivation of said sampled signal is delayed by an odd number of zero crossings of the A.C. power supply voltage.

According to an embodiment of the present invention, said odd number is 3.

The present invention also provides a circuit for detecting a possible overheating of an A.C. switch, comprising:

a comparator of a voltage proportional to the current temperature with respect to a threshold; and a flip-flop rated at a frequency corresponding to an even multiple of the frequency of the A.C. voltage.

According to an embodiment of the present invention, a counter of an odd number of zero crossings of the A.C. voltage is activated by the output signal of said flip-flop and is rated at the same frequency.

According to an embodiment of the present invention, said flip-flop is controlled by a signal for detecting the zero crossing of the A.C. supply voltage.

According to an embodiment of the present invention, said flip-flop is controlled by a signal for detecting the zero crossing of the current through the switch.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 4, previously described, shows a conventional example of an electric diagram of the circuit of FIG. 3;

FIG. 5 is a schematic block diagram of a first embodiment of a detection circuit according to the present invention;

FIGS. 6A, 6B, and 6C are timing diagrams illustrating the operation of the circuit of FIG. 5;

FIGS. 7A, 7B, 7C and 7D are timing diagrams illustrating a risk of malfunction of the circuit of FIG. 5 on an inductive load;

FIG. 8 shows a second embodiment of a detection circuit according to the present invention; and FIGS. 9A, 9B, 9C, and 9D are timing diagrams illustrating the operation of the circuit of FIG. 8.

DETAILED DESCRIPTION

Figure 1:
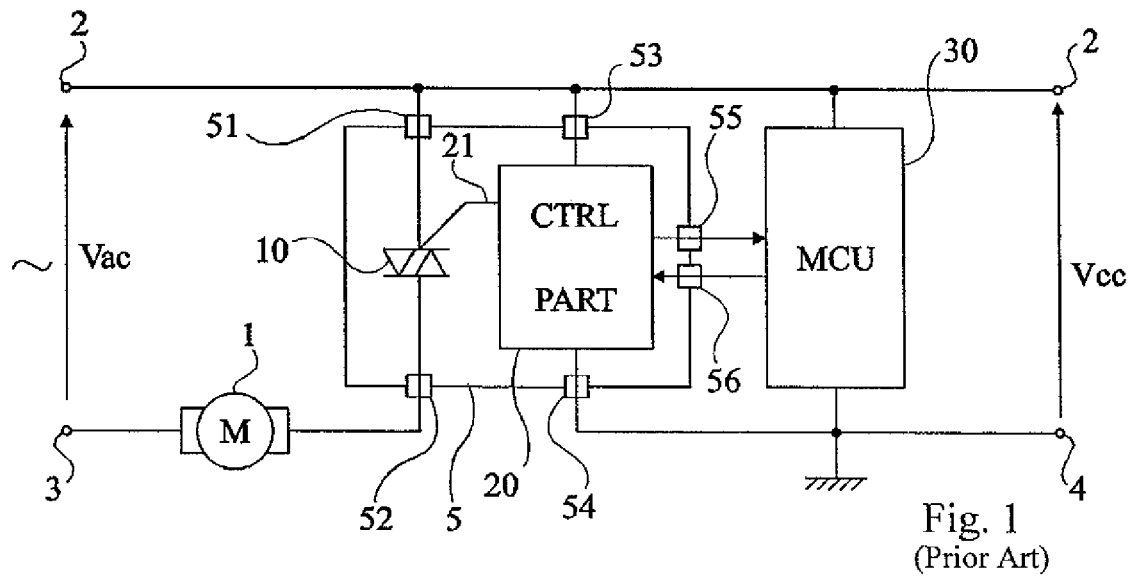
FIG. 1, previously described, shows an example of a conventional architecture of the circuit for controlling a load with an A.C. voltage of the type to which the present invention applies.

The same elements have been designated with the same reference numerals in the different drawings which have been drawn out of scale. For clarity, only those elements which are useful to the understanding of the present invention have been shown and will be described hereafter. In particular, what exploitation is made of the detection signal in the case of a control by means of a microprocessor has not been detailed, the present invention being compatible with any performed conventional exploitation of a temperature detection signal exceeding a threshold.

FIG. 5 is a schematic block diagram of a first embodiment of an overheating detection circuit 40' according to the present invention.

Figure 3:
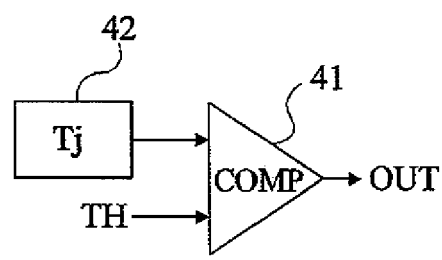
FIG. 3, previously described, schematically shows in the form of blocks a conventional example of a temperature detection circuit.

As previously, circuit 40' uses a comparator 41 having a first input receiving information Vptat about the junction temperature Tj (block 42) and having a second input receiving, for example, a voltage Vth provided by a reference generator of band-gap type. The output of comparator 41 provides a two-state signal V41, indicative of a possible exceeding of the temperature. Up to now, the discussed structure may be identical to that previously described in relation with FIG. 3.

According to this embodiment of the present invention, signal V41 is sampled by a flip-flop 51 having a data input D receiving the output of comparator 41 and having its Q output providing a signal V51. Signal V51 forms, in this example, two-state result signal OVT inhibiting the switch turning-on (10, FIG. 1) by being provided to circuit 20 (or to the rest of circuit 20 if it is integrated therewith) and/or to unit 30. The clock input of flip-flop 51 receives a signal CK having its frequency selected to correspond to an even multiple (preferably, twice) the frequency of A.C. supply voltage Vac of the load (1, FIG. 1).

FIGS. 6A, 6B, and 6C illustrate the operation of the detector of FIG. 5, assuming a purely resistive load. FIG. 6A shows an example of the shape of current I in the switch (10, FIG. 1) on powering on. FIG. 6B shows the shape of voltage Vptat representative of temperature Tj. FIG. 6C shows the shape of output signal V41 of comparator 41. An active signal V41 (indicating that the threshold temperature has been exceeded) in the high state (symbolized by 1) approximately representing level Vcc is assumed.

It is assumed that on a first positive halfwave of the power supply voltage, current I (FIG. 6A) is sufficiently high for voltage Vptat to exceed threshold Vth (FIG. 6B) but that this overcharge is temporary, for example, a transient overcharge at the load start-up (first powering on). As a result, the current amplitude at the next halfwave is lower than that of the first halfwave and so on on the next halfwaves, to reach a steady state.

On the temperature measurement side (FIG. 6B), the shape of voltage Vptat follows the decrease in the amplitude of the absolute value of the current until the value remains under threshold Vth, for example, at the third half-period.

According to this embodiment of the present invention, the fact of sampling signal V41 (FIG. 6C) provided by comparator 41 at times t1, t2, t3, and t4 spaced apart from one another by a half-period of the power supply voltage enables not taking into account transient exceedings of the acceptable temperature. Of course, if the heating is lasting, it will be present for a time period greater than one half-period and will thus be detected.

The present invention takes advantage from the fact that the switch is not controllable to be turned off so that the presence of a heating for a time period reaching one half-period of the A.C. power supply voltage can anyway not be avoided, since the control circuit (20, FIG. 1) can only prevent the switch from turning on at the next halfwave.

Accordingly, the implementation of the present invention does not adversely affect the detector operation in case of a real overcharge. It however avoids untimely triggerings.

The sampling period may be greater than one half-period of the A.C. power supply voltage, provided for it to be an integral multiple of this half-period, to avoid sampling the signal on the current peaks.

As appears from the foregoing, a preferred embodiment of the present invention comprises selecting the sampling times (active edges of signal CK) approximately at the voltage or current zero.

In the case of a resistive load, a measurement (sampling) at the zero crossing of the power supply voltage is generally simpler than at the current zero. An advantage of a measurement at the current zero however is that it is independent from the type of connected load.

In the case of a measurement at the voltage zero on an inductive or capacitive load, the sampling times may be delayed with respect to the zero crossing times to take into account the phase shift between the current in the switch and the power supply voltage. Such a shift is not necessary in case of a measurement at the current zero.

If the detector is directly laid on the switch, a measurement synchronized on the current in the switch is preferred, since the heat propagation time can be considered as null.

Figure 2:
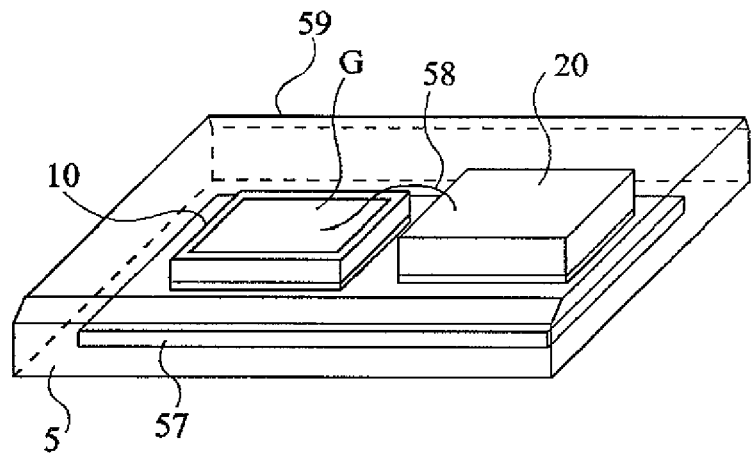
FIG. 2, previously described, is a simplified view of an integrated circuit forming a bi-directional control switch.

If the temperature detector is placed close to the switch in a package, as illustrated in FIG. 2, there anyway is a time shift between the variation of the junction temperature of detector 42 and the temperature seen from switch 10, so that a measurement at the voltage zero even on a capacitive or inductive load is not harmful.

Further, the period of power supply voltage Vac is generally greater than 10 ms (from 16 to 20 ms for the mains voltage). The propagation times and uncertainties of the detections of the current or voltage zero crossing are negligible as compared with this time period.

FIGS. 7A, 7B, 7C, and 7D are timing diagrams illustrating, in an example of shapes of signals I, Vptat, V41, and OVT on an inductive load, a risk of instability of the system with the detector of FIG. 5.

Assume an overcharge to be detected, the temperature level being greater than the threshold for more than one half-period (from a time t10 in the fifth halfwave). This overcharge is taken into account by flip-flop 51 at the next zero crossing (time t11), which forbids the switch from turning on in the halfwave starting at time t11. This enables cooling down of the switch. In the example, a cooling down sufficiently fast for voltage V41 to fall below threshold Vth during the sixth halfwave (at a time t12) is assumed, but the problem discussed hereafter also arises if several halfwaves are necessary. At the zero crossing (time t13) following time t12, flip-flop 51 deactivates signal OVT and the switch can turn on. If, as shown, the starting back up of the load occurs by chance on a halfwave of same biasing as the last conduction halfwave, a remanence phenomenon, and thus a new transient overcharge, can be observed on an at least partially inductive load. Threshold Vth is thus immediately crossed back (time t14) with an amplitude sufficient for the time period necessary to cool down not to avoid a triggering of the temperature security (activation of the signal OVT at time t15). If this phenomenon occurs, the systems becomes unsteady until a restarting occurs by chance on a halfwave of opposite biasing to the last conduction halfwave.

A first solution is to take the chance of such an instability.

A second solution is to select the sampling frequency to be large enough with respect to the frequency of the power supply voltage to enable sufficient cooling down between two restartings. A disadvantage is that this occurs to the detriment of the system responsiveness.

A third solution applicable to a circuit controlled by a processor 30 is to prevent, by means of this processor, a restarting on a halfwave of a biasing opposite to that of the last power supply halfwave. This however requires detecting the biasing.

FIG. 8 shows a second embodiment of a circuit for detecting whether a temperature has been exceeded according to the present invention, which is a fourth preferred solution with a risk of unsteadiness on an at least partially inductive load. This circuit remains based on that of FIG. 5 that it completes.

The Q output of flip-flop 51 is sent to the start input of a counter 52 (COUNT 2n+1, n being a positive integer) having its output providing result signal OVT. The counter is activated by a state switching of the Q output so that the activation of signal OVT is immediate. Counter 52 is reset (or overflows) after an odd number of periods of clock signal CK of the flip-flop. For example, the counter counts down a number 2n+1 activated by flip-flop 51 and thus provides an output OVT in the low state at the end of the down counting. The selection of an odd number (2n+1) of zero crossings prevents the restarting of switch 10 on a halfwave of same biasing as that where the overcharge has disappeared by counting an even number of mains periods.

FIGS. 9A, 9B, 9C, and 9D are timing diagrams showing an example of shapes of signals I, Vptat, V41, and OVT, to be compared with those of FIGS. 7A to 7D, to illustrate the operation of the circuit of FIG. 8. In this example, the counter is assumed to count three zero crossings (n=1).

The operation is identical to that discussed in relation with FIGS. 7A to 7D until time t11 of activation of signal OVT. However, at time t13 when, with no counter, the sampling of signal V41 enables a restarting, this restarting is inhibited as long as the counter has not switched signal OVT back to state 0. At end-of-count time t17, signal V41 is still low (the load has not been started since time t11). Accordingly, switch 10 is turned on on a halfwave of a biasing opposite to the last conduction halfwave. Current I then exhibits no peak (or a very low peak with respect to a restarting on a same biasing) so that signal Vptat, even if it transiently crosses threshold Vth at the restarting time, does not result in a new starting of the thermal protection. Of course, if for any other reason (environmental temperature, long cooling time, etc.), voltage Vptat is still greater than threshold Vth at time t17, the counter is reactivated and blocks the restarting again.

The present invention is likely to have various alterations, modifications, and improvements which will readily occur to those skilled in the art. In particular, the practical forming of the detection electronic circuits illustrated in the form of functional blocks is within the abilities of those skilled in the art based on the indications given hereabove. Further, the obtaining of a clock signal of the flip-flop and of the counter from a detector of the voltage or current zero uses conventional circuits, a detector of the voltage or current zero being generally present in switch control circuit 20. Further, although the present invention has, to simplify the discussion, been described without taking into account possible delays due to the propagation times, their taking into account poses no problem.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for detecting an overheating of an electronic switch of power supply of a load by an A.C. voltage, wherein a voltage representative of the temperature in the vicinity of the switch is compared with a threshold, the result of this comparison being sampled at zero values of the A.C. power supply voltage and at a frequency corresponding to an even multiple of the frequency of the A.C. power supply voltage, to provide a signal indicative of the fact that a temperature threshold has been exceeded.

2. The method of claim 1, wherein the sampling frequency corresponds to twice the frequency of the power supply voltage.

3. The method of claim 1, wherein a deactivation of said sampled signal is delayed by an odd number of zero crossings of the A.C. power supply voltage.

4. The method of claim 3, wherein said odd number is 3.

5. A circuit for detecting a possible overheating of an A.C. switch, comprising:
   a comparator of an A.C. voltage proportional to the current temperature with respect to a threshold; and
   a flip-flop sampled at zero values of the A.C. voltage and at a frequency corresponding to an even multiple of the frequency of the A.C. voltage.

6. The circuit of claim 5, wherein a counter of an odd number of zero crossings of the A.C. voltage is activated by the output signal of said flip-flop and is sampled at the same frequency as the flip-flop.

7. The circuit of claim 5, wherein said flip-flop is controlled by a signal for detecting the zero crossing of the A.C. supply voltage.

8. The circuit of claim 5, wherein said flip-flop is controlled by a signal for detecting the zero crossing of the current through the switch.

* * * * *